US012615448B2

(12) United States Patent
Tang et al.

(10) Patent No.: US 12,615,448 B2
(45) Date of Patent: Apr. 28, 2026

(54) WHITE-INFRA-RED IMAGE SENSOR HAVING UNIT PIXEL WITH VERTICALLY STACKED ARRANGEMENT OF PHOTOELECTRIC CONVERSION REGIONS

(71) Applicant: Himax Imaging Limited, Tainan City (TW)

(72) Inventors: Ya-Wen Tang, Tainan City (TW); Dong-Long Lin, Tainan City (TW)

(73) Assignee: Himax Imaging Limited, Tainan City (TW)

( * ) Notice: Subject to any disclaimer, the term of this patent is extended or adjusted under 35 U.S.C. 154(b) by 178 days.

(21) Appl. No.: 18/637,477

(22) Filed: Apr. 17, 2024

(65) Prior Publication Data

US 2025/0343997 A1 Nov. 6, 2025

(51) Int. Cl.

| | |
|---|---|
| *H04N 25/17* | (2023.01) |
| *H04N 25/10* | (2023.01) |
| *H04N 25/131* | (2023.01) |
| *H04N 25/702* | (2023.01) |
| *H10F 39/00* | (2025.01) |
| *H10F 39/12* | (2025.01) |
| *H10F 39/18* | (2025.01) |

(52) U.S. Cl.
CPC ............. *H04N 25/17* (2023.01); *H04N 25/10* (2023.01); *H04N 25/131* (2023.01); *H04N 25/702* (2023.01); *H10F 39/184* (2025.01); *H10F 39/199* (2025.01); *H10F 39/80* (2025.01); *H10F 39/802* (2025.01)

(58) Field of Classification Search
CPC .............................. H04N 25/131; H04N 25/17
See application file for complete search history.

(56) References Cited

U.S. PATENT DOCUMENTS

| | | | | |
|---|---|---|---|---|
| 10,056,423 | B1 * | 8/2018 | Huang | ................ H10F 39/8057 |
| 2005/0264662 | A1 * | 12/2005 | Suzuki | .................. H10F 39/802 |
| | | | | 348/294 |
| 2010/0141771 | A1 * | 6/2010 | Hu | ....................... H10F 39/8053 |
| | | | | 438/66 |

(Continued)

FOREIGN PATENT DOCUMENTS

| | | | |
|---|---|---|---|
| JP | 2017011758 A | * | 1/2017 |
| JP | 2018139451 A | * | 9/2018 |

(Continued)

*Primary Examiner* — David N Werner
(74) *Attorney, Agent, or Firm* — Winston Hsu

(57) ABSTRACT

A unit pixel includes: a substrate having a light-receiving side and a front side; a first photoelectric conversion region and a second photoelectric conversion region. The first photoelectric conversion region is disposed in the substrate and configured to convert a first component of incident light within a first light wavelength range to generate a first charge. The second photoelectric conversion region is disposed in the substrate and configured to convert a second component of the incident light within a second wavelength range to a second charge. Specifically, the second photoelectric conversion region is interposed between the first photoelectric conversion region and the light-receiving side of the substrate; and the first photoelectric conversion region and the second photoelectric conversion region are spaced apart by a gap region.

10 Claims, 5 Drawing Sheets

(56) References Cited

U.S. PATENT DOCUMENTS

| | | | | |
|---|---|---|---|---|
| 2010/0220228 A1* | 9/2010 | Otake | .................... | H04N 23/11 |
| | | | | 348/311 |
| 2010/0310282 A1* | 12/2010 | Kerxhalli | .......... | G03G 15/6564 |
| | | | | 399/301 |
| 2011/0049333 A1* | 3/2011 | Yamashita | ............. | H04N 25/17 |
| | | | | 438/74 |
| 2011/0304753 A1* | 12/2011 | Shintani | ............... | H04N 25/133 |
| | | | | 348/E9.002 |
| 2013/0075607 A1* | 3/2013 | Bikumandla | ......... | H04N 25/17 |
| | | | | 257/E31.127 |
| 2013/0221197 A1* | 8/2013 | Shimotsusa | ............... | G01J 1/44 |
| | | | | 250/206 |
| 2013/0234029 A1* | 9/2013 | Bikumandla | ......... | H10W 90/00 |
| | | | | 257/432 |
| 2014/0061439 A1* | 3/2014 | Toda | ....................... | H10F 77/40 |
| | | | | 313/504 |
| 2015/0270314 A1* | 9/2015 | Miyazaki | ............. | H10F 39/026 |
| | | | | 257/53 |
| 2016/0211295 A1* | 7/2016 | Chen | .................. | H10F 39/8037 |
| 2018/0020169 A1* | 1/2018 | Mogi | ..................... | H04N 5/144 |
| 2019/0260952 A1* | 8/2019 | Lee | ........................ | H04N 23/11 |
| 2019/0319061 A1* | 10/2019 | Liu | ........................ | H04N 25/59 |
| 2019/0348460 A1* | 11/2019 | Chen | ..................... | H10F 39/809 |
| 2019/0371860 A1* | 12/2019 | Choi | ..................... | H10F 39/192 |
| 2020/0137368 A1* | 4/2020 | Taoka | .................. | H04N 25/131 |
| 2021/0193708 A1* | 6/2021 | Roy | ..................... | H10F 39/802 |
| 2021/0235046 A1* | 7/2021 | Lee | ..................... | H10F 39/8067 |
| 2022/0141399 A1* | 5/2022 | Dupoiron | .............. | H04N 25/65 |
| | | | | 348/164 |
| 2022/0190016 A1* | 6/2022 | Dupoiron | ............. | H04N 25/131 |
| 2022/0359586 A1* | 11/2022 | Kim | ..................... | H10F 39/807 |
| 2023/0268366 A1* | 8/2023 | Baek | ................. | H10F 39/80373 |
| | | | | 257/432 |
| 2023/0362518 A1* | 11/2023 | Shiina | ................... | H10F 39/182 |
| 2024/0053447 A1* | 2/2024 | Ohkubo | ................ | G01S 7/4816 |
| 2024/0145496 A1* | 5/2024 | Togashi | ............. | H10F 39/8023 |
| 2024/0298096 A1* | 9/2024 | Iijima | ................... | H04N 23/56 |

FOREIGN PATENT DOCUMENTS

| | | | | | |
|---|---|---|---|---|---|
| WO | WO-2005109511 A1 * | 11/2005 | .......... | H10F 39/807 |
| WO | WO-2010134147 A1 * | 11/2010 | .......... | H04N 25/771 |
| WO | WO-2024210220 A1 * | 10/2024 | ............ | H10F 39/12 |

* cited by examiner

WHITE-INFRA-RED IMAGE SENSOR HAVING UNIT PIXEL WITH VERTICALLY STACKED ARRANGEMENT OF PHOTOELECTRIC CONVERSION REGIONS

BACKGROUND OF THE INVENTION

1. Field of the Invention

The present invention relates generally to imaging devices, and more particularly, to white-IR imaging sensors having unit pixels with a vertically stacked arrangement of photoelectric conversion regions.

2. Description of the Prior Art

Complementary metal-oxide-semiconductor (CMOS) image sensor technology offers lower power consumption, faster readout speeds, and great low-light sensitivity, making them highly advantageous for other image sensing technologies. Their ability to efficiently convert light into electronic signals has led to their widespread adoption across various domains, including consumer electronics, automotive safety systems, medical imaging, security, and surveillance.

In certain applications, the requirement for capturing a broad spectrum of light, encompassing both visible and infra-red wavelengths, is necessary. For instance, advanced security cameras, multifunctional medical imaging equipment, and autonomous vehicle sensing systems often necessitate simultaneous acquisition of visible and infra-red light information to perform comprehensive scene analysis and object detection under varying lighting conditions. Given these requirements, there is a need within the technical field for a composite CMOS image sensor capable of simultaneously capturing and measuring both visible and infrared light.

SUMMARY OF THE INVENTION

With this in mind, it is one object of the present invention to provide a white (visible light)-IR (infra-red light) imaging sensor having unit pixels with a vertically stacked arrangement of photoelectric conversion regions. In the present invention, the vertically stacked arrangement facilitates differentiated photoelectric conversion efficiencies for different wavelengths of incident light, which obviates the necessity for conventional color filters typically required to achieve spectral selectivity. This significantly reduces the complexity and the cost of fabrication. Moreover, the vertically stacked arrangement of photoelectric conversion regions also allows for a higher pixel density within a given unit area of the image sensor, potentially enhancing the modulation transfer function (MTF) of the image sensor.

According to one embodiment, a unit pixel is provided. The unit pixel comprises: a substrate having a light-receiving side and a front side; a first photoelectric conversion region and a second photoelectric conversion region. The first photoelectric conversion region is disposed in the substrate and configured to convert a first component of incident light within a first light wavelength range to generate a first charge. The second photoelectric conversion region is disposed in the substrate and configured to convert a second component of the incident light within a second wavelength range to a second charge. Specifically, the second photoelectric conversion region is interposed between the first photoelectric conversion region and the light-receiving side of the substrate; and the first photoelectric conversion region and the second photoelectric conversion region are spaced apart by a gap region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
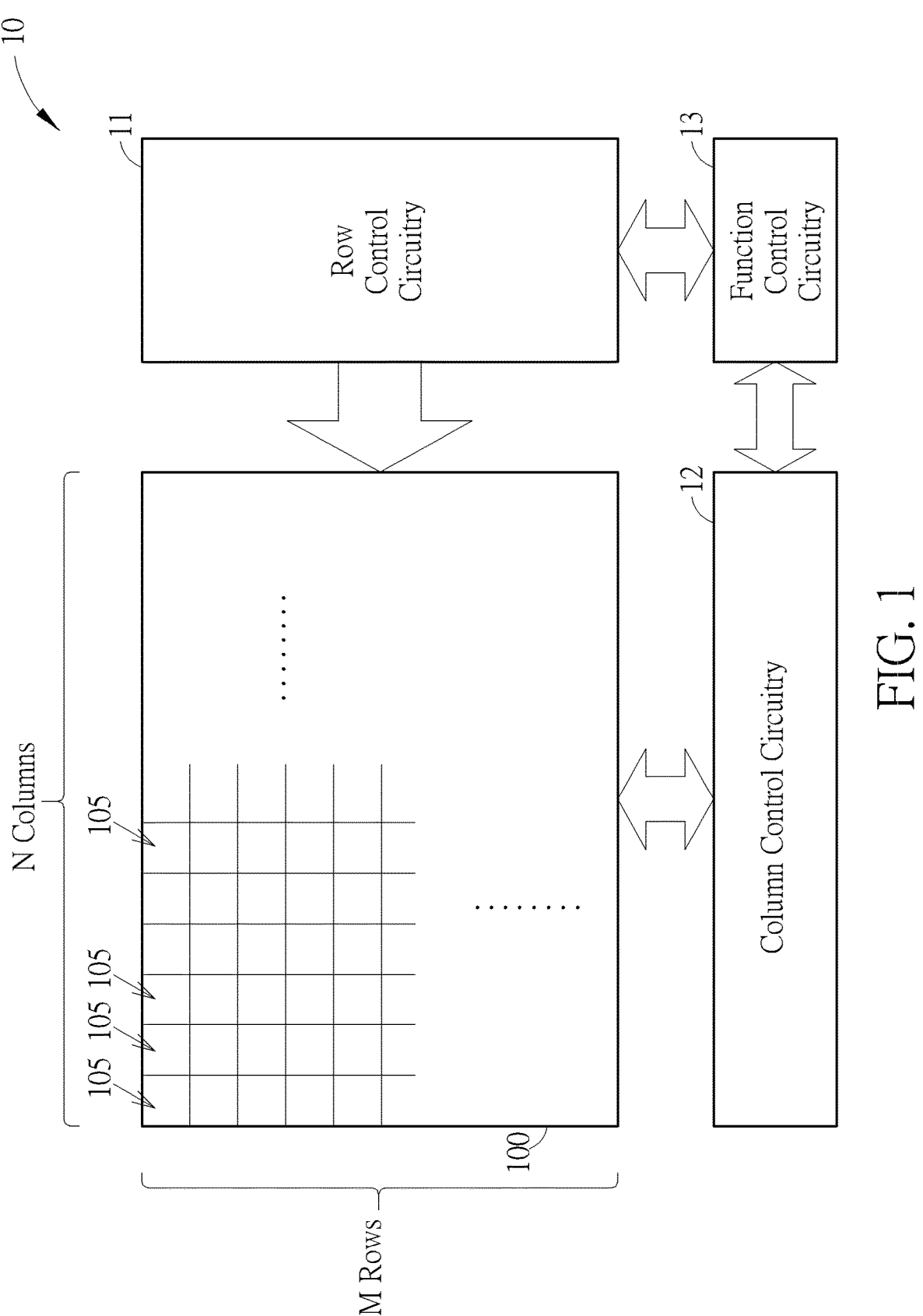
FIG. 1 is a schematic diagram illustrating an image sensor according to one embodiment of the present invention.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment.

Please refer to FIG. 1, which illustrates an image sensor 10. In one embodiment, the image sensor 10 is a complementary metal-oxide-semiconductor (CMOS) image sensor and may be implemented as a backside illuminated image sensor. Moreover, the image sensor 10 could be a white (visible light)-IR (infra-red light) imaging sensor and includes a pixel array 100 containing a plurality of unit pixels 105. The unit pixels may be arranged two-dimensionally, for example, may be arranged in the form of a matrix consisting of M rows and N columns. The image sensor 10 further includes a row control circuitry 11, and a column control circuitry 12 and a function control circuitry 13.

The row control circuitry 11 may receive row addresses from the function control circuitry 13 and supply corresponding row control signals (e.g., reset, row-selecting, charge transfer, and readout control signals) to the unit pixels 105. The column control circuitry 12 may receive image signals from the pixel array 100. The column control circuitry 12 may include (but is not shown): sample-and-hold circuitry for sampling and temporarily storing image signals read out from the pixel array 100, amplifier circuitry for amplifying the image signals, analog-to-digital conversion circuitry for converting the image signals into digital pixel values, bias circuitry for charging columns of the pixel array 100 and/or other circuitry that is coupled to one or more columns of unit pixels 105 in the pixel array 100 for operating the unit pixels 105 and for reading out the image signals from unit pixels 105. The column control circuitry 12 may supply digital pixel values to the function control circuitry 13 for further processing.

Figure 2:
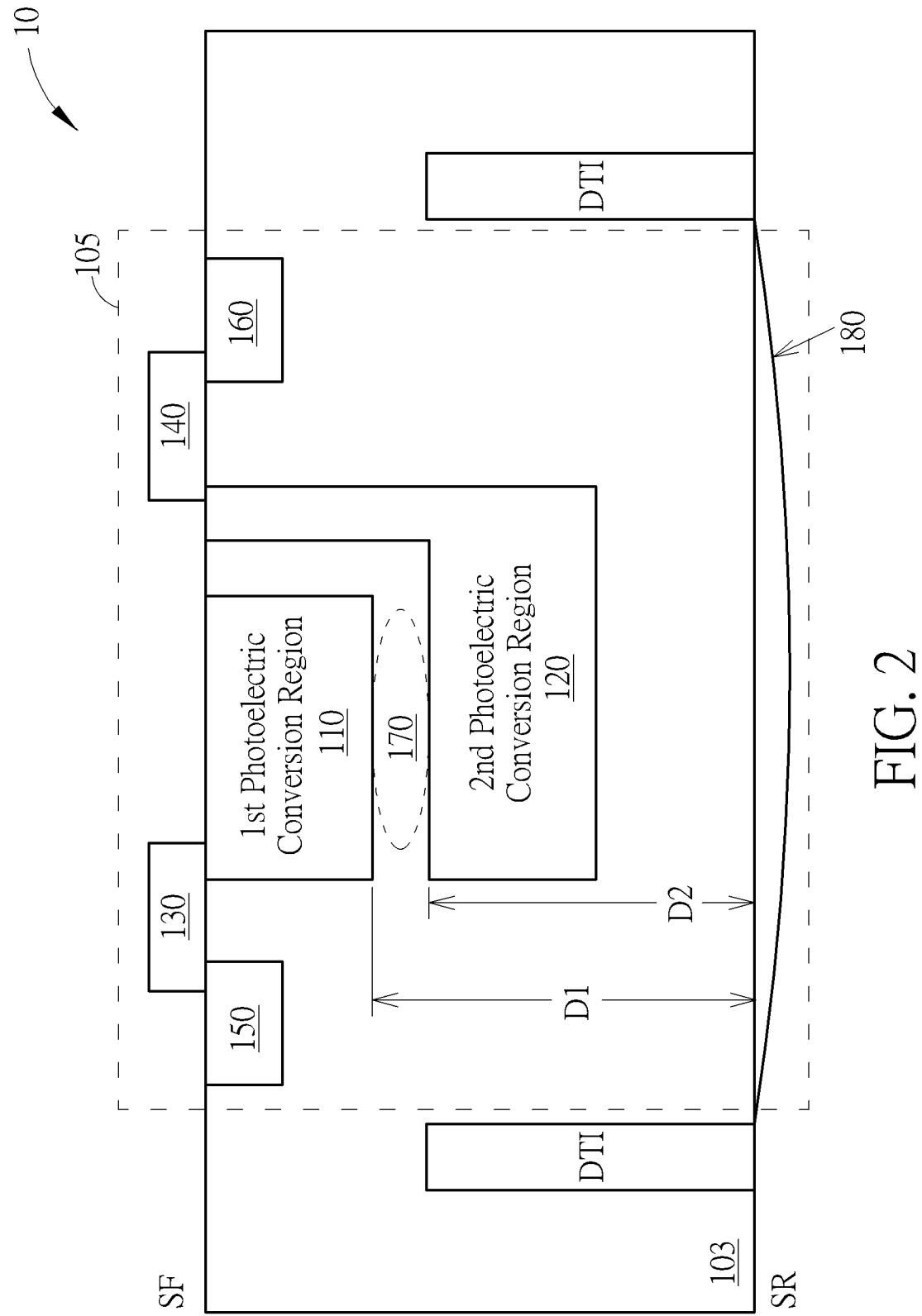
FIG. 2 is a diagram illustrating a cross-sectional view of semiconductor structure of a unit pixel of a white-IR image sensor according to one embodiment of the present invention.

FIG. 2 illustrates a cross-section view of a semiconductor structure of the image sensor 10 according to one embodiment. Please note that figures herein and after are not drawn to scale, unless otherwise indicated. By way of illustration and not limitation, the image sensor 10 includes a unit pixel 105. However, according to various embodiments, the image sensor 10 may further include a variety of additional and/or alternative pixel structures. As illustrated, the image sensor 10 includes a semiconductor layer 103. In one embodiment, the semiconductor layer 103 may be a substrate. In and/or on the substrate 103, there are disposed various structures of respective unit pixels 105. The substrate 103 has a front side SF and a light-receiving side SR. That is, the image sensor 10 is operable as backside illuminated.

Figure 3:
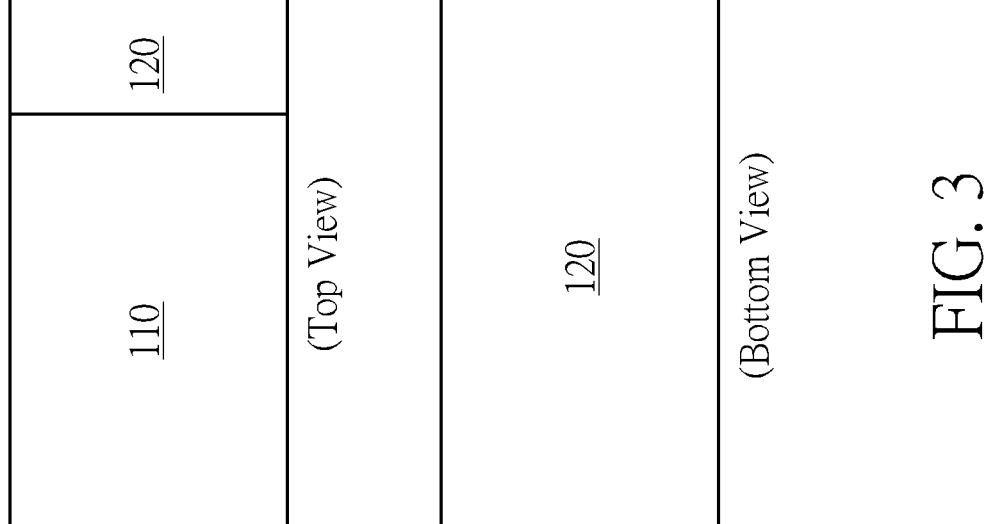
FIG. 3 is a diagram illustrating a top view and a bottom view of semiconductor structure of a unit pixel of a white-IR image sensor according to one first embodiment of the present invention.

In the substrate 103, each unit pixel 105 comprises a first photoelectric conversion region 110 and a second photoelectric conversion region 120. The first photoelectric conversion region 110 and the second photoelectric conversion region 120 are configured in a stacked arrangement along a vertical axis with respect to the light-receiving surface SR of the substrate 103, facilitating differentiated photoelectric conversion efficiencies for different wavelengths of incident light. Moreover, the second photoelectric conversion region 120 has an L-shaped structure, and a portion of the second photoelectric conversion region 120 extends vertically upwards to the front side SF of the substrate 103 (as illustrated by FIG. 2 and FIG. 3). According to various embodiments, each of first photoelectric conversion region 110 and the second photoelectric conversion region 120 may be implemented as a photodiode, a phototransistor, a photogate, a pinned-photodiode, or a combination thereof.

The first photoelectric conversion region 110, positioned closer to the front side SF of the substrate 103, is configured to sense and convert photons from a first light component of the incident light from the light-receiving side SR, within a first wavelength range, and accordingly produce a first charge. Specifically, the first wavelength range is primarily focused on infra-red wavelengths (i.e., an infra-red band), spanning approximately from about 700 nm to 1 mm. Since longer wavelengths of light can penetrate deeper into the substrate 103, reaching the first photoelectric conversion region 110, such that the first photoelectric conversion region 110 exhibits a higher photoelectric conversion efficiency for photons of longer wavelengths, thereby providing the first photoelectric conversion region 110 with enhanced infrared sensitivity. According to various embodiments of the present invention, the first wavelength range may be a limited to specific segments of the IR spectrum, such as near-infrared light, short-wavelength infrared light, mid-wavelength infrared light, long-wavelength infrared light, or far-infrared light, either individually or in some combination thereof.

Moreover, the second photoelectric conversion region 120, positioned closer to the light-receiving side SR, is configured to sense and convert photons from a second light component of the incident light within a second wavelength range, and accordingly produce a second charge. Specifically, the second wavelength range is primarily focused on a visible light wavelength range (i.e., a visible light band), spanning approximately from about 360 nm to 760 nm. Since shorter wavelengths of light as shorter wavelengths (e.g., visible light) are more readily absorbed in shallower regions in the substrate 103, the second photoelectric conversion region 120, by virtue of its positioning, is optimized for higher photoelectric conversion efficiency for photons of shorter wavelengths (i.e., visible light).

Through such positioning and specialization of the photoelectric conversion regions 110 and 120 along the vertical axis of the substrate 103, the unit pixel 105 achieves differentiated photoelectric conversion efficiencies across a broad spectrum of incident light. Consequently, such pixel structure obviates the necessity for conventional color filters typically required to achieve spectral selectivity. That is to say, there is no color filter layer disposed between a micro lens layer 180 and the substrate 103 in this embodiment.

The unit pixel 105 further includes: a first floating diffusion region 150 and a second floating diffusion region 160, both of which are disposed in the substrate 103. The first floating diffusion region 150 and the second floating diffusion region 160 have capacitances and are used to convert the first charge and the second transferred from the photoelectric conversion regions 110 and 120 into voltage signals. Subsequently, these voltage signals can be efficiently read out by the readout circuit integrated into the column control circuitry 12 as an instance of sensed pixel data.

In addition, the unit pixel 105 includes a first gate region 130 and a second gate region 140. The first gate region 130 is disposed on the front side SF of the substrate 103, positioned over the first floating diffusion region 150 and the first photoelectric conversion region 110. The first gate region 130 is configured to control transfer of the first charge from the first photoelectric conversion region 110 to the first floating diffusion region 150 by providing a channel therebetween. Similarly, the second gate region 140 is disposed on the front side SF of the substrate 103, positioned over the second floating diffusion region 160 and the second photoelectric conversion region 120. The second gate region 140 is configured to control transfer of the second charge from the second photoelectric conversion region 120 to the second floating diffusion region 160 by providing a channel therebetween.

Moreover, the unit pixel 105 has deep trench isolation (DTI) regions, disposed within the substrate 103 and positioned around the second photoelectric conversion region 120, which is configured to prevent electrical current leakage and mitigate interferences from adjacent unit pixels 105.

Figure 4:
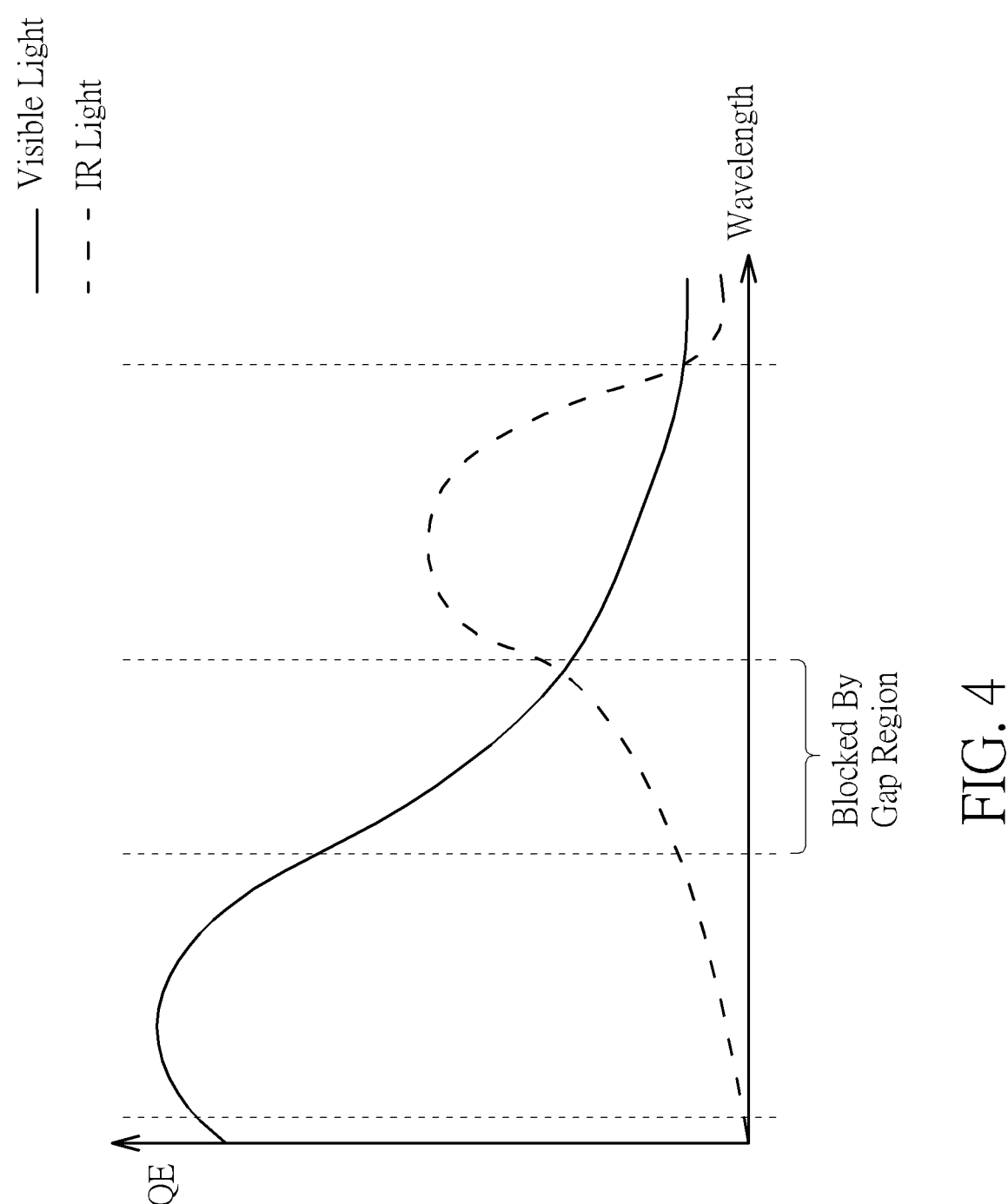
FIG. 4 is a diagram illustrating quantum efficiency QE of the unit pixel in relation to wavelength.

In addition, the first photoelectric conversion region 110 and the second photoelectric conversion region 120 are spaced apart by a gap region 170. That is, the gap region 170 sandwiched therebetween. The gap region 170 is configured to block a third component of the incident light within a third wavelength range, preventing it from being absorbed by the first photoelectric conversion 110. That is, the gap region 170 serves to selectively filter out a specific component of the incident light within a designated wavelength range. Please refer to FIG. 4, which is a diagram illustrating quantum efficiency (QE) of the unit pixel 105 in relation to wavelength. FIG. 4 demonstrates better QE range for visible light due to the positioning of the second photoelectric conversion region 120, and better QE range for infra-red light due to the positioning of the first photoelectric conversion region 110. To further differentiate the first wavelength range and the second wavelength range, thereby precisely sensing the photons of the visible light and the infra-red light, the gap region 170 can be used to block photons of the visible light which penetrates the second photoelectric region 120, prevent it from being absorbed by the first photoelectric region 110. Specifically, by adjusting positions D1 and D2 (i.e., the depth and the thickness) of the gap region 170 in the substrate, the absorption for the first and second wavelength ranges can be finely tuned, enabling the first photoelectric region 110 to more precisely capture the intensity of infra-red light. In other words, the first wavelength range can be determined by the depth and the thickness of the gap region 170.

Figure 5:
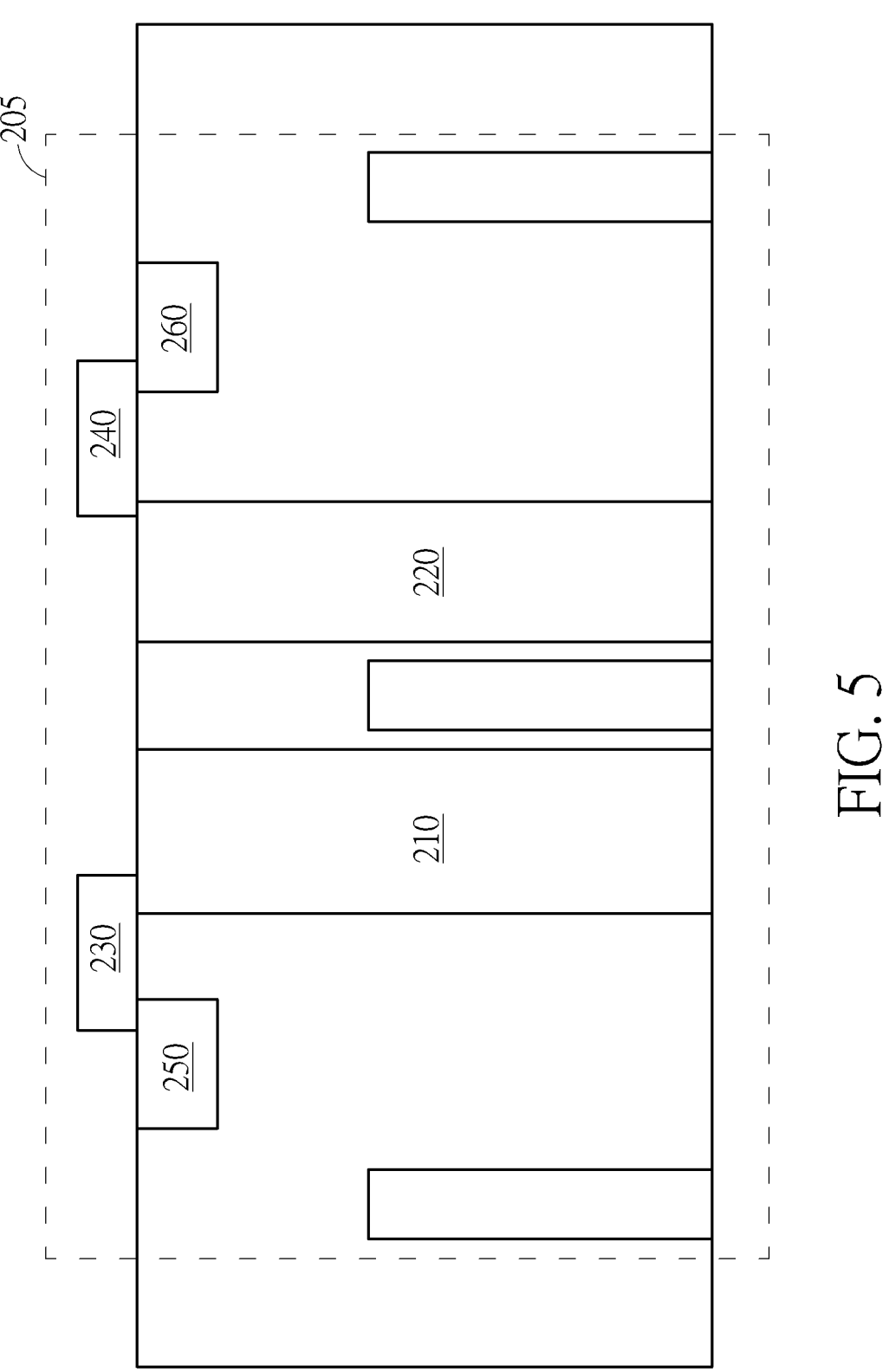
FIG. 5 is a diagram illustrating a cross-sectional view of semiconductor structure of a unit pixel of a conventional white-IR image sensor.

FIG. 5 illustrates semiconductor structure of a unit pixel 205 of a conventional white-IR image sensor. The unit pixel 205 includes a first photoelectric conversion region 210, a second photoelectric conversion region 220, gate regions 230 and 240, floating diffusion regions 250 and 260. The first photoelectric conversion region 210 is configured to convert photons from visible light component of incident light into charge, while the second photoelectric conversion region 220 is configured to convert photons from infra-red light component of incident light into charge. The gate regions 230 and 240 are configured to respectively control transfer of charges from the first and second photoelectric conversion regions 210 and 220 to the floating diffusion regions 250 and 260.

As illustrated, the first and second photoelectric conversion regions 210 and 220 are not configured in a stacked arrangement. Instead, the first and second photoelectric conversion regions 210 and 220 are arranged side by side along a horizontal axis in relation to the substrate. This lateral arrangement may lead to a larger pixel footprint compared to vertically stacked arrangement of the unit pixel

105 of the present invention. In view of this, the innovative structure of unit pixel 105, as proposed by the present invention, introduces a vertically stacked arrangement of photoelectric conversion regions. Such structural optimization allows for a higher pixel density within a given unit area of the image sensor, potentially enhancing the modulation transfer function (MTF) of the image sensor, indicating that unit pixel 105 could significantly improve image quality by ensuring higher resolution and better contrast fidelity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A unit pixel, comprising:
a substrate having a light-receiving side and a front side;
a first photoelectric conversion region, disposed in the substrate, configured to convert a first component of incident light within a first light wavelength range to generate a first charge; and
a second photoelectric conversion region, disposed in the substrate, configured to convert a second component of the incident light within a second wavelength range to a second charge;
wherein the second photoelectric conversion region is interposed between the first photoelectric conversion region and the light-receiving side of the substrate; and the first photoelectric conversion region and the second photoelectric conversion region are spaced apart by a gap region;
wherein the second photoelectric conversion region has an L-shaped structure, and a portion of the second photoelectric conversion region extends vertically upwards to the front side of the substrate.

2. The unit pixel of claim 1, wherein the first wavelength range corresponds to an infra-red wavelength range, and the second wavelength range corresponds to a visible light wavelength range.

3. The unit pixel of claim 1, further comprising:
a micro lens layer, disposed on the light-receiving side of the substrate, wherein there is no color filter layer disposed between the micro lens layer and the substrate.

4. The unit pixel of claim 1, further comprising:
a plurality of deep trench isolation regions, disposed in the substrate and positioned around the second photoelectric conversion region.

5. The unit pixel of claim 1, wherein the gap region between the first photoelectric conversion region and the second photoelectric conversion region is configured to block a third component of the incident light within a third wavelength range, preventing it from being absorbed by the first photoelectric conversion.

6. The unit pixel of claim 5, wherein the first wavelength range is determined according to a depth and a thickness of the gap region.

7. The unit pixel of claim 5, wherein the unit pixel is backside illuminated.

8. An image sensor comprising a plurality of unit pixels of claim 1 that are two-dimensionally arranged.

9. A unit pixel, comprising:
a substrate having a light-receiving side and a front side;

a first photoelectric conversion region, disposed in the substrate, configured to convert a first component of incident light within a first light wavelength range to generate a first charge;

a second photoelectric conversion region, disposed in the substrate, configured to convert a second component of the incident light within a second wavelength range to a second charge;

a first floating diffusion region, disposed in the substrate;

a first gate region, disposed on the front side of the substrate and positioned over the first floating diffusion region and the first photoelectric conversion region, configured to control transfer of the first charge from the first photoelectric conversion region to the first floating diffusion region by providing a channel therebetween;

a second floating diffusion region, disposed in the substrate; and a second gate region, disposed on the front side of the substrate and positioned over the second floating diffusion region and the second photoelectric conversion region, configured to control transfer of the second charge from the second photoelectric conversion region to the second floating diffusion region by providing a channel therebetween;

wherein the second photoelectric conversion region is interposed between the first photoelectric conversion region and the light-receiving side of the substrate; and the first photoelectric conversion region and the second photoelectric conversion region are spaced apart by a gap region.

10. An image sensor comprising a plurality of unit pixels of claim 9 that are two-dimensionally arranged.

* * * * *